(12) United States Patent
Yeo et al.

(10) Patent No.: US 9,786,750 B2
(45) Date of Patent: Oct. 10, 2017

(54) THIN FILM TRANSISTOR SUBSTRATES INCLUDING FIRST AND SECOND DRAIN ELECTRODES AND DISPLAY DEVICES INCLUDING THE SAME

(71) Applicant: Samsung Display Co., Ltd., Yongin, Gyeonggi-Do (KR)

(72) Inventors: Yong-Suk Yeo, Seongnam-si (KR); Yi-Joon Ahn, Seoul (KR); Jong-Mo Yeo, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 191 days.

(21) Appl. No.: 14/510,284

(22) Filed: Oct. 9, 2014

(65) Prior Publication Data

US 2015/0115252 A1    Apr. 30, 2015

(30) Foreign Application Priority Data

Oct. 25, 2013    (KR) .................. 10-2013-0127581

(51) Int. Cl.
*H01L 27/32* (2006.01)
*H01L 29/417* (2006.01)
*H01L 27/12* (2006.01)
*H01L 29/66* (2006.01)

(52) U.S. Cl.
CPC ...... *H01L 29/41733* (2013.01); *H01L 27/124* (2013.01); *H01L 27/3248* (2013.01); *H01L 27/3262* (2013.01); *H01L 29/66757* (2013.01); *H01L 29/66969* (2013.01)

(58) Field of Classification Search
CPC ............... H01L 27/124; H01L 27/3248; H01L 27/3262; H01L 29/41733
See application file for complete search history.

(56) References Cited

U.S. PATENT DOCUMENTS 8,441,182 B2    5/2013  Son
8,466,467 B2    6/2013  Jung
(Continued)

FOREIGN PATENT DOCUMENTS

JP    2006-066917 A    3/2006
JP    4368200 B2       9/2009
(Continued)

OTHER PUBLICATIONS

English machine translation of KR1020130015069A of record.*

*Primary Examiner* — Marcos D Pizarro
*Assistant Examiner* — Christopher M Roland
(74) *Attorney, Agent, or Firm* — Cantor Colburn LLP

(57) ABSTRACT

A thin film transistor substrate includes a data line, a gate line, a gate electrode, a source electrode, a first drain electrode, a semiconductor layer and a second drain electrode. The data line and the gate line cross each other on a base substrate. The gate electrode is electrically connected to the gate line. The source electrode is electrically connected to the data line. The first drain electrode and the source electrode face each other. The semiconductor layer serves as a channel between the source electrode and the first drain electrode. The second drain electrode is disposed on the first drain electrode. The second drain electrode is electrically connected to the first drain electrode.

18 Claims, 14 Drawing Sheets

(56) References Cited

U.S. PATENT DOCUMENTS

| | | | |
|---|---|---|---|
| 2003/0168992 A1* | 9/2003 | Noguchi | H01L 27/3276 315/169.3 |
| 2004/0087067 A1* | 5/2004 | Yoneda | G02F 1/136227 438/148 |
| 2004/0238886 A1* | 12/2004 | Lee | H01L 27/12 257/347 |
| 2005/0104814 A1* | 5/2005 | Choi | G09G 3/3233 345/76 |
| 2008/0150437 A1* | 6/2008 | Iida | G09G 3/3233 315/169.3 |
| 2008/0227245 A1 | 9/2008 | Lee et al. | |
| 2012/0306841 A1 | 12/2012 | Toya | |
| 2013/0112976 A1 | 5/2013 | Kim et al. | |
| 2013/0119388 A1 | 5/2013 | Lee et al. | |
| 2013/0257698 A1* | 10/2013 | Toya | H01L 27/124 345/77 |

FOREIGN PATENT DOCUMENTS

| | | |
|---|---|---|
| JP | 2012-252131 A | 12/2012 |
| KR | 1020110015757 A | 2/2011 |
| KR | 1020120051337 A | 5/2012 |
| KR | 1020120052851 A | 5/2012 |
| KR | 1020120061000 A | 6/2012 |
| KR | 1020130007872 A | 1/2013 |
| KR | 1020130015069 A | 2/2013 |
| KR | 1020130051813 A | 5/2013 |

\* cited by examiner

THIN FILM TRANSISTOR SUBSTRATES INCLUDING FIRST AND SECOND DRAIN ELECTRODES AND DISPLAY DEVICES INCLUDING THE SAME

This application claims priority to Korean Patent Application No. 10-2013-0127581 filed on Oct. 25, 2013, and all the benefits accruing therefrom under 35 USC §119, the entire disclosure of which is incorporated by reference herein.

BACKGROUND

1. Field

Exemplary embodiments relate to thin film transistor substrates, methods of manufacturing the same and display devices including the same. More particularly, exemplary embodiments relate to thin film transistor substrates capable of realizing high resolution, methods of manufacturing the same and display devices including the same.

2. Description of the Related Art

A thin film transistor ("TFT") is widely used as a switching device of a display device including, e.g., an organic light emitting display ("OLED") device, a liquid crystal display ("LCD") device, etc. The TFT may include a gate electrode electrically connected to a gate line, a semiconductor layer insulated from the gate electrode, and source and drain electrodes electrically connected to the semiconductor layer.

When an area for the TFT is increased, an aperture ratio and a resolution of the display device may be decreased.

SUMMARY

One or more exemplary embodiment provides a thin film transistor ("TFT") substrate having a high degree of integration.

One or more exemplary embodiment provides a method of manufacturing a TFT substrate having a high degree of integration.

One or more exemplary embodiment provides a display device including a TFT substrate with a high degree of integration.

According to an exemplary embodiment, there is provided a TFT substrate. The TFT substrate includes a data line, a gate line, a gate electrode, a source electrode, a first drain electrode, a semiconductor layer and a second drain electrode. The data line and the gate line cross each other on a base substrate. The gate electrode is electrically connected to the gate line. The source electrode is electrically connected to the data line. The first drain electrode and the source electrode face each other. The semiconductor layer serves as a channel between the source electrode and the first drain electrode. The second drain electrode is disposed on the first drain electrode. The second drain electrode is electrically connected to the first drain electrode.

In exemplary embodiments, the second drain electrode may serve as a land for a pixel electrode contact of a display device.

In exemplary embodiments, the second drain electrode may be in a different layer from that of the first drain electrode.

In exemplary embodiments, the TFT substrate may include a first contact which electrically connects the first drain electrode and the second drain electrode to each other.

In exemplary embodiments, the channel may extend in a direction parallel to an extending direction of the gate line.

In exemplary embodiments, the channel may extend in a direction vertical to an extending direction of the gate line.

In exemplary embodiments, the source electrode may be connected to the data line via a connecting portion which protrudes from the data line.

In exemplary embodiments, the second drain electrode may fully cover a top surface of the first drain electrode.

In exemplary embodiments, the TFT substrate may include a first contact which electrically connects the first drain electrode and the second drain electrode to each other. The first contact and the first drain electrode may be arranged along the same line extending vertically with respect to a top surface of the base substrate.

In exemplary embodiments, the TFT substrate may include a gate insulation layer which covers the semiconductor layer on the base substrate. The gate electrode may be disposed on the gate insulation layer.

In exemplary embodiments, the TFT substrate may include a gate insulation layer which covers the gate electrode on the base substrate. The semiconductor layer may be disposed on the gate insulation layer.

According to another exemplary embodiment, there is provided a method of manufacturing a TFT substrate. In the method, a semiconductor layer which serves as a channel is formed on a base substrate. A gate insulation layer which covers the semiconductor layer is formed. A gate electrode which is superimposed over the semiconductor layer is formed on the gate insulation layer. A source electrode and a first drain electrode which are respectively in contact with ends of the semiconductor layer are formed. A second drain electrode is formed on the first drain electrode. The second drain electrode is electrically connected to the first drain electrode.

In exemplary embodiments, an insulating interlayer which covers the source electrode, the first drain electrode and the gate electrode may be formed. A first contact which makes contact with the first drain electrode may be formed extended through the insulating interlayer.

In exemplary embodiments, the second drain electrode may be formed on the insulating interlayer and in contact with the first contact.

In exemplary embodiments, a gate line and a data line which cross each other may be formed on the base substrate. The forming the gate line may simultaneously form the gate electrode, and the forming the data line may simultaneously form the source electrode and the first drain electrode.

According to an exemplary embodiment, there is provided a display device. The display device includes a base substrate, a TFT on the base substrate, a second drain electrode, a first electrode, an organic light emitting layer on the first electrode and a second electrode on the organic light emitting layer. The TFT includes a gate electrode, a gate insulation layer, a semiconductor layer, a source electrode and a first drain electrode. The second drain electrode is disposed on the first drain electrode to be electrically connected to the first drain electrode. The first electrode is electrically connected to the second drain electrode.

In exemplary embodiments, the display device may include a first contact and a second contact. The first contact may make contact with the first drain electrode and the second drain electrode. The second contact may make contact with the second drain electrode and the first electrode.

In exemplary embodiments, the second contact may have a top plan view dimension or a cross-section dimension larger than that of the first contact.

In exemplary embodiments, the display device may include an insulating interlayer which covers the TFT.

In exemplary embodiments, the first contact may extend through the insulating interlayer, and the second drain electrode may be disposed on the insulating interlayer.

According to one or more exemplary embodiment, a second drain electrode of a TFT in contact with a pixel electrode contact of a display device may be in and/or on a different layer or a different level from that of a first drain electrode of the TFT. Thus, a space for forming the second drain electrode may be additionally obtained. Further, the second drain electrode may be closer to a date line or a gate line, so that an area of the TFT may be minimized in a pixel region of the display device. Therefore, a display device having an increased aperture ratio and a relatively high resolution may be manufactured using the TFT substrate.

BRIEF DESCRIPTION OF THE DRAWINGS

Exemplary embodiments will be more clearly understood from the following detailed description taken in conjunction with the accompanying drawings. FIGS. 1 to 24 represent non-limiting, exemplary embodiments as described herein:

FIG. 1 is a top plan view illustrating an exemplary embodiment of a thin film transistor ("TFT") substrate in accordance with the invention;

FIG. 3 is a cross-sectional view illustrating a comparative example of a TFT substrate.

FIGS. 5 to 9 are cross-sectional views illustrating an exemplary embodiment of a method of manufacturing the TFT substrate of FIGS. 1, 2A and 2B;

FIG. 10 is a top plan view illustrating another exemplar embodiment of a TFT substrate in accordance with the invention;

FIG. 11 is a cross-sectional view taken along line III-III' of FIG. 10;

FIG. 12 is a top plan view illustrating still another exemplary embodiment of a TFT substrate in accordance with the invention;

FIG. 13 is a cross-sectional view taken along line III-III' of FIG. 12;

FIG. 14 is a top plan view illustrating yet another exemplary embodiment of a TFT substrate in accordance with the invention;

FIGS. 16 to 19 are cross-sectional views illustrating an exemplary embodiment of a method of manufacturing the TFT substrate of FIGS. 14, 15A and 15B;

FIG. 20 is a top plan view illustrating an exemplary embodiment of a display device in accordance with the invention;

FIG. 21 is a cross-sectional view taken along line VI-VI' of FIG. 20; and

FIGS. 22 to 24 are cross-sectional views illustrating an exemplary embodiment of a method of manufacturing the display device of FIGS. 20 and 21.

DETAILED DESCRIPTION

Figure 1:
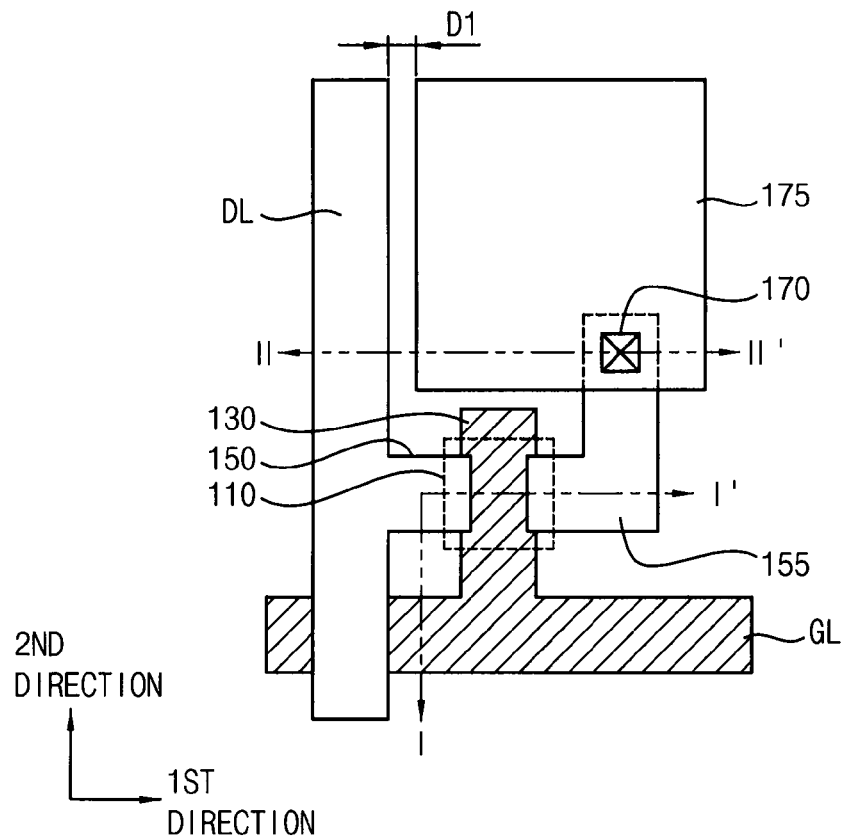

Various exemplary embodiments will be described more fully hereinafter with reference to the accompanying drawings, in which exemplary embodiments are shown. The invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). As used herein, connected may refer to elements being physically, and/or electrically connected to each other.

Spatially relative terms, such as "under," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2A:
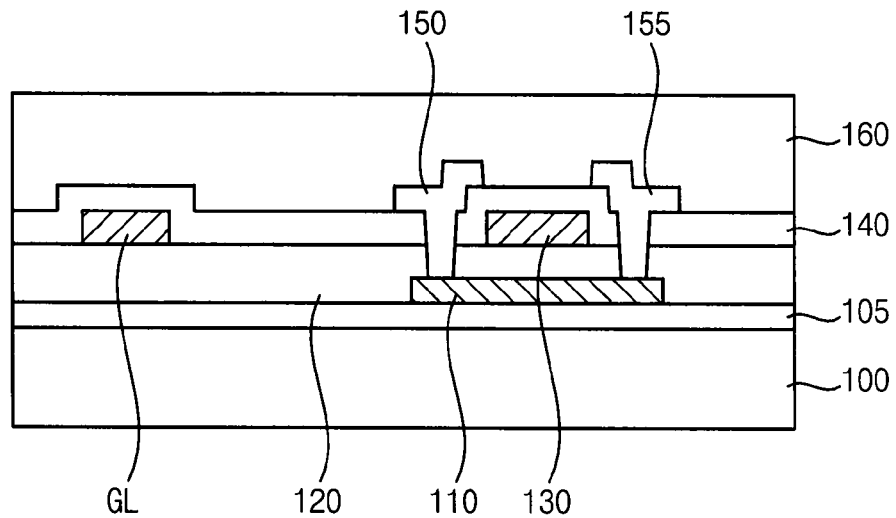
FIGS. 2A and 2B are cross-sectional views taken along line I-I' and II-II' of FIG. 1, respectively.
Figure 2B:
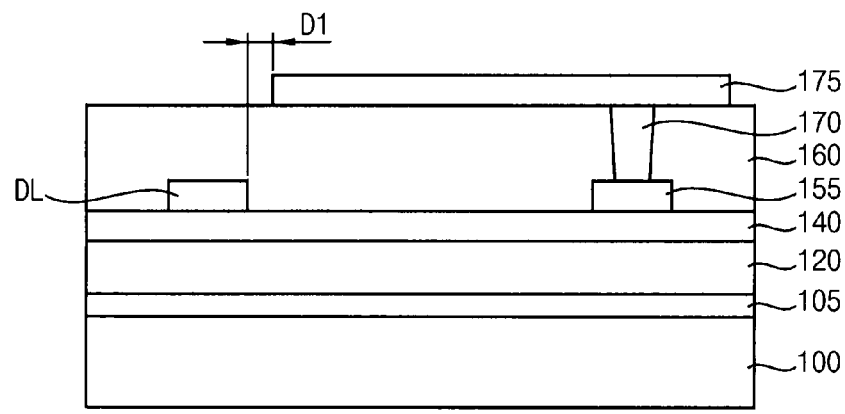

FIG. 1 is a top plan view illustrating an exemplary embodiment of a thin film transistor ("TFT") substrate in accordance with the invention. FIGS. 2A and 2B are cross-sectional views taken along line I-I' and II-II' of FIG. 1, respectively.

For convenience of explanation, some elements of the TFT substrate may be omitted in FIG. 1. For example, FIG. 1 illustrates a semiconductor layer, a data line, a gate line, a gate electrode, a source electrode and a drain electrode. In FIG. 1, two directions substantially parallel to a top surface of a base substrate and substantially perpendicular to each other are referred to as a first direction and a second direction. The definition of the directions is commonly applied substantially throughout all the descriptions.

Referring to FIG. 1, the TFT substrate may include a data line DL, a gate line GL, a semiconductor layer 110, a gate electrode 130, a source electrode 150, a first drain electrode 155, a second drain electrode 175 and a first contact 170.

The gate line GL may extend in the first direction. A plurality of the gate lines GL may be disposed along the second direction. The data line DL may extend in the second direction. A plurality of the data lines DL may be disposed along the first direction.

In the illustrated exemplary embodiment, for example, the data lines DL may cross over the gate lines GL. In one exemplary embodiment, a pixel region of a display device may be defined by an intersection region of the data lines DL and the gate lines GL, but the invention is not limited thereto or thereby.

The gate electrode 130 may protrude from the gate line GL in the second direction. The gate electrode 130 may be integral with the gate line GL, such that the gate line GL including the gate electrode 130 is a single, unitary, indivisible member.

The source electrode 150 may protrude from the data line DL in the first direction. The source electrode 150 may be integral with the data line DL, such that the data line DL including the source electrode 150 is a single, unitary, indivisible member.

The first drain electrode 155 may be spaced apart from the source electrode 150 along the first direction, such that the source electrode 150 and the first drain electrode 155 may face each other with respect to the gate electrode 130. In an exemplary embodiment of manufacturing the TFT substrate, the first drain electrode 155 may be patterned simultaneously with the source electrode 150, such that the first drain electrode 155 and the data line DL including the source electrode 150 are in a same layer and/or include a same material.

The semiconductor layer 110 indicated by dotted lines in FIG. 1 may substantially overlap with the source electrode 150, the first drain electrode 155 and the gate electrode 130.

A TFT may be defined by the semiconductor layer 110, the gate electrode 130, the source electrode 150 and the first drain electrode 155.

The second drain electrode 175 may be disposed on the first drain electrode 155. The first and second electrodes 155 and 175 may be electrically connected to each other through the first contact 170. The first and second electrodes 155 and 175 are in different layers of the TFT substrate, such as being in different single layers of the TFT substrate.

Hereinafter, a structure and/or a construction of the TFT substrate are described in more detail with reference to FIGS. 2A and 2B. FIGS. 2A and 2B illustrate a top gate type TFT in which the gate electrode 130 is disposed on the semiconductor layer 110.

Referring to FIG. 2A, the semiconductor layer 110 and the gate electrode 130 may be disposed on a base substrate 100, and the source electrode 150 and the first drain electrode 155 may be disposed over the gate electrode 130 to be in contact with the semiconductor layer 110.

The base substrate 100 may include an insulation substrate such as a glass substrate or a transparent plastic substrate. In one exemplary embodiment, a buffer layer 105 may be disposed on the base substrate 100. The buffer layer 105 may include, for example, silicon oxide (SiOx), silicon nitride (SiNx) or silicon oxynitride (SiOxNy).

The semiconductor layer 110 may include, for example, amorphous silicon, polysilicon or an oxide semiconductor. The oxide semiconductor may include, for example, indium gallium zinc oxide ("IGZO"), zinc tin oxide ("ZTO") or indium tin zinc oxide ("ITZO"). The semiconductor layer 110 may serve as a channel of the TFT through which charges or electrons are transferred between the source electrode 150 and the first drain electrode 155.

A gate insulation layer 120 may be disposed on the base substrate 100 to cover the semiconductor layer 110. The gate insulation layer 120 may include silicon oxide or silicon nitride. The gate insulation layer 120 may include a single-layered structure, but the invention is not limited thereto. In one exemplary embodiment, the gate insulation layer 120 may have a multi-layered structure including silicon oxide and silicon nitride.

The gate line GL and the gate electrode 130 may be disposed on the gate insulation layer 120. The gate electrode 130 may have a substantially rectangular cross section as illustrated in FIG. 2A. Alternatively, the gate electrode 130 may have a substantially trapezoidal cross section. The gate electrode 130 may have a single-layered structure, or a multi-layered structure including a plurality of conductive layers.

As described with reference to FIG. 1, the gate line GL and the gate electrode 130 may be integral with each other and may include substantially the same material. In one exemplary embodiment, for example, the gate electrode 130 may include a metal such as aluminum (Al), copper (Cu), molybdenum (Mo), titanium (Ti) or silver (Ag), or an alloy thereof. Alternatively, the gate electrode 130 may include a transparent conductive material such as indium tin oxide ("ITO"), indium zinc oxide ("IZO") or aluminum doped zinc oxide ("AZO").

A first insulating interlayer 140 may be disposed on the gate insulation layer 120 to cover the gate line GL and the gate electrode 130. The source electrode 150 and the first drain electrode 155 may extend through cross-sectional thicknesses of the first insulating interlayer 140 and the gate insulation layer 120 to be in contact with the semiconductor layer 110.

The first insulating interlayer 140 may include an insulation material such as silicon oxide or silicon nitride. The first insulating interlayer 140 may protrude from the gate insulation layer 120 according to a shape of the gate electrode 130, in a cross-sectional view. Alternatively, when the first insulating interlayer 140 has a sufficient cross-sectional thickness, the first insulating interlayer 140 may have a substantially even or leveled upper surface (e.g., not protruded).

The source electrode 150 and the first drain electrode 155 may be in contact with the semiconductor layer 110 via contact holes defined through the first insulating interlayer 140 and the gate insulation layer 120.

As described with reference to FIG. 1, the source electrode 150 and the first drain electrode 155 may include the same material as that of the data line DL. In one exemplary embodiment, for example, the source electrode 150 and the first drain electrode 155 may include a metal such as Al, Cu, Mo, Ti or Ag, or an alloy thereof. Alternatively, the source electrode 150 and the first drain electrode 155 may include a transparent conductive material such as ITO, IZO or AZO.

In exemplary embodiments, ohmic contact layers (not illustrated) may be disposed at both of opposing ends of the semiconductor layer 110 which are in contact with the source electrode 150 and the first drain electrode 155, respectively. The ohmic contact layer may include n-type or p-type impurities.

A second insulating interlayer 160 may be disposed on the first insulating interlayer 140 to cover the source electrode 150 and the first drain electrode 155. The second insulating interlayer 160 may include an insulation material such as silicon oxide or silicon nitride.

As illustrated in FIGS. 1 and 2B, the second drain electrode 175 may be disposed on the second insulating interlayer 160 to be electrically connected to the first drain electrode 155 via the first contact 170 that may extend through a cross-sectional thickness of the second insulating interlayer 160. In exemplary embodiments, the second drain electrode 175 and the first contact 170 may be integral with each other, such that the second drain electrode 175 and the first contact 170 form a single, unitary, indivisible member.

The second drain electrode 175 and the first contact 170 may include a metal such as Al, Cu, Mo, Ti or Ag, or an alloy thereof. Alternatively, the second drain electrode 175 and the first contact 170 may include a transparent conductive material such as ITO, IZO or AZO. In one exemplary embodiment, the second drain electrode 175, the first contact 170 and the first drain electrode 155 may include substantially the same conductive material so that contact resistances therebetween may be reduced.

In exemplary embodiments, the second drain electrode 175 may serve as a land for a conductive via or a pixel electrode contact when the TFT substrate is employed in a display device.

Figure 3:
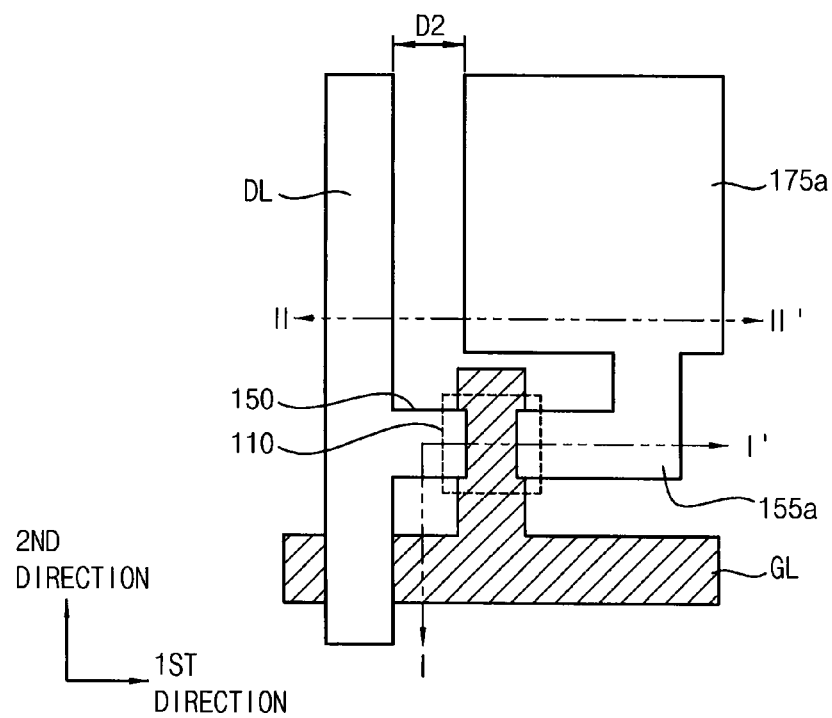
Figure 4A:
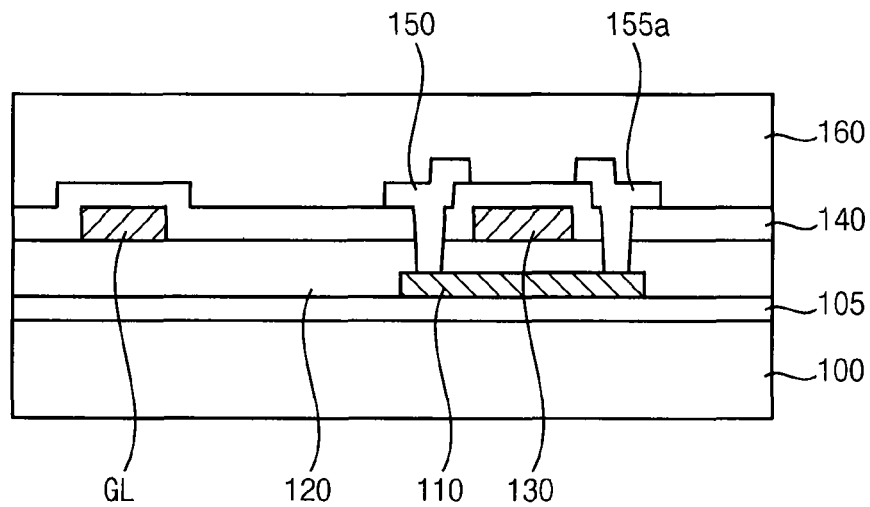
FIGS. 4A and 4B are cross-sectional views taken along line I-I' and II-II' of FIG. 3, respectively.
Figure 4B:
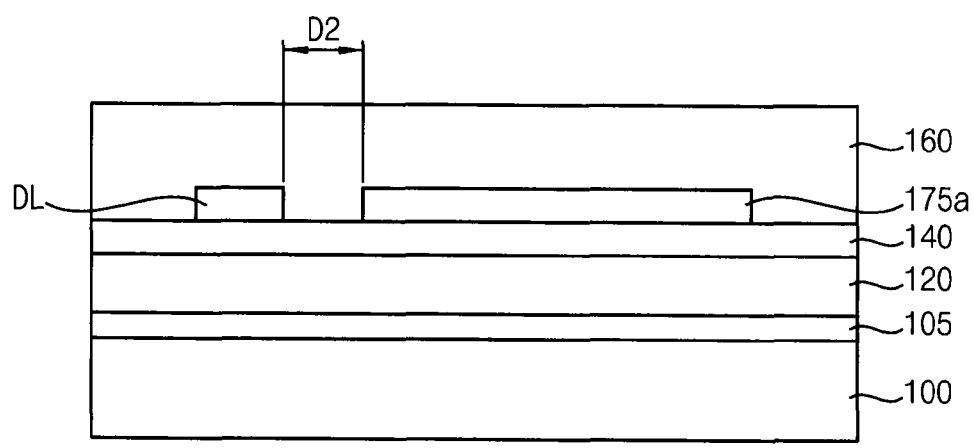

FIG. 3 is a cross-sectional view illustrating a comparative example of a TFT substrate. FIGS. 4A and 4B are cross-sectional views taken along line I-I' and II-II' of FIG. 3, respectively. The TFT substrate according to the comparative example may have a construction substantially the same as or similar to that illustrated with reference to the exemplary embodiment of FIGS. 1 and 2A and 2B except for a shape and/or an arrangement of a second drain electrode. Thus, detailed descriptions on elements and/or structures substantially the same as or similar to those illustrated with reference to FIGS. 1 and 2A and 2B are omitted. Like reference numerals are used to refer to like elements.

Referring to FIGS. 3, 4A and 4B, a first drain electrode 155a and a second drain electrode 175a may be disposed in and/or on a same layer or at same level within the TFT substrate according to the comparative example. As described with reference to FIG. 2B, the second drain electrode 175 may be disposed on the second insulating interlayer 160 and in a different layer than first drain electrode 155, to be electrically connected to the first drain electrode 155 via the first contact 170. However, according to the comparative example, the drain electrode 175a may be integral with the first drain electrode 155a to be disposed on the first insulating interlayer 140 and in a same layer as the first drain electrode 155a.

In the comparative example, the data line DL, the first drain electrode 155a and the second drain electrode 175a may be in and/or on a same level or in a same plane so that a formation of a TFT having a compact size may be limited. In one exemplary embodiment, for example, a predetermined distance referred to as "D2" between the data line DL and the second drain electrode 175a may be required in consideration of an alignment tolerance when the data line DL and the second drain electrode 175a are formed using one patterning mask in a method of manufacturing the TFT substrate.

However, according to one or more exemplary embodiment in accordance with the invention, a distance between the data line DL and the second drain electrode 175 (referred to as "D1") may be minimized without a consideration of the alignment tolerance because the second drain electrode 175 is disposed in and/or on a different level or a different layer from those of the data line DL and the first drain electrode 155. Therefore, an overall area (e.g., planar area) for the TFT may be minimized in a display device so that an aperture ratio and a resolution of the display device may be improved.

In exemplary embodiments, the drain electrode 175 may be partially superimposed over the data line DL. In one exemplary embodiment, the second drain electrode 175 may be spaced apart from the data line DL with a distance smaller than D2 of FIGS. 3 and 4B in consideration of a parasitic capacitance that may be generated between the second drain electrode 175 and the date line DL.

Figure 7:
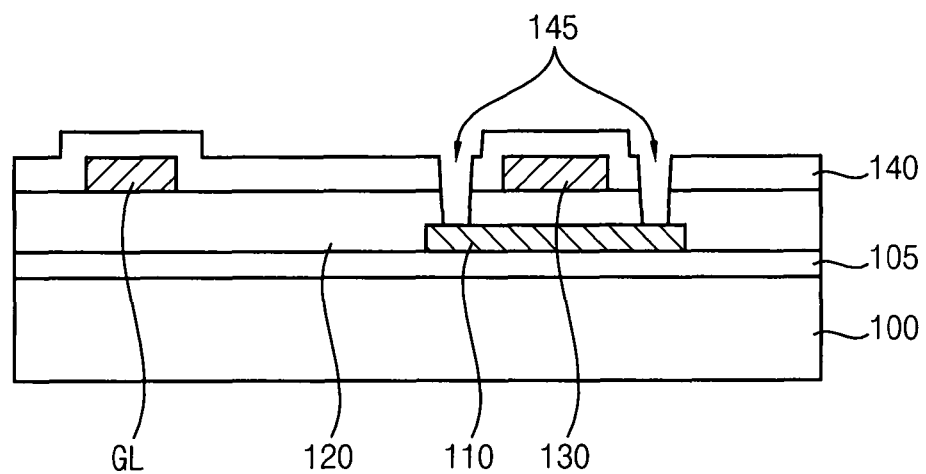
Figure 8:
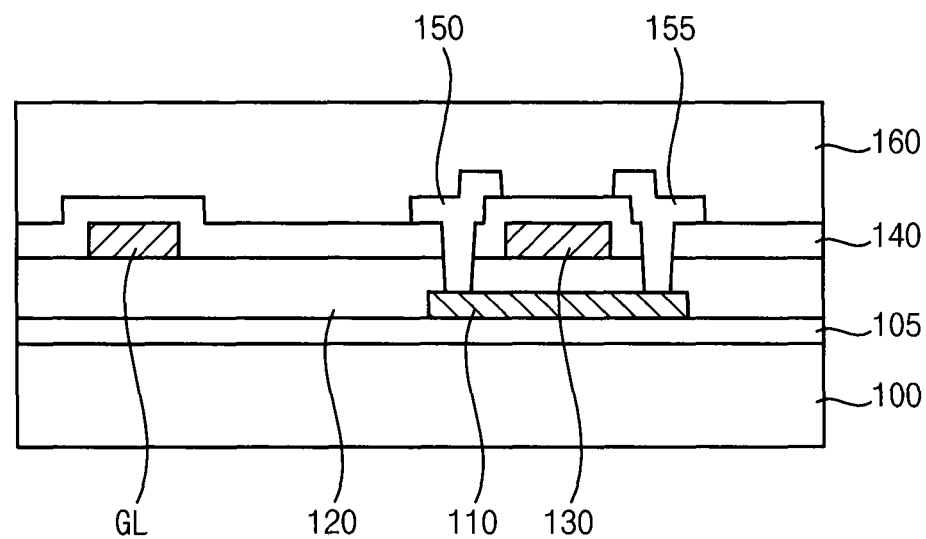
Figure 9:
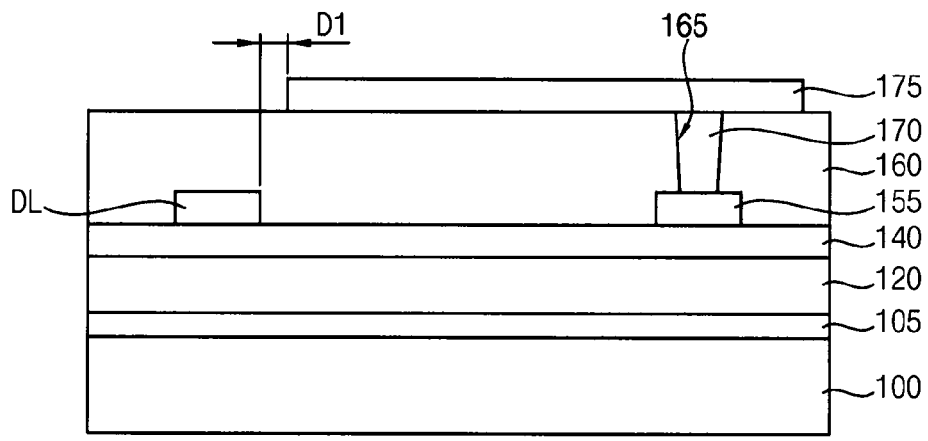

FIGS. 5 to 9 are cross-sectional views illustrating an exemplary embodiment of a method of manufacturing the TFT substrate of FIGS. 1, 2A and 2B. Specifically, FIGS. 5 to 8 are cross-sectional views taken along a direction of line I-I' of FIG. 1. FIG. 9 is a cross-sectional view taken along a direction of line II-II' of FIG. 1.

Figure 5:
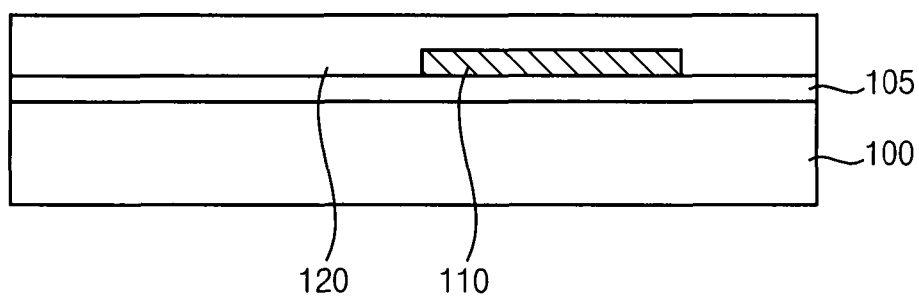

Referring to FIG. 5, a buffer layer 105 may be formed on a base substrate 100. A semiconductor layer 110 may be formed on the buffer layer 105. A gate insulation layer 120 covering the semiconductor layer 110 may be formed on the buffer layer 105.

An insulation substrate such as a glass substrate or a transparent plastic substrate may be used as the base substrate 100. The buffer layer 105 may be formed using an insulation material such as silicon oxide, silicon nitride or silicon oxynitride by a chemical vapor deposition ("CVD") process, a plasma enhanced chemical vapor deposition ("PECVD") process or a high density plasma-chemical vapor deposition ("HDP-CVD") process, etc.

An amorphous silicon layer, a polysilicon layer or an oxide semiconductor layer may be deposited on the buffer layer 105 by a sputtering process, a CVD process, a low pressure CVD ("LPCVD") process, a vacuum evaporation process, etc., and then the semiconductor layer 110 may be obtained by patterning the amorphous silicon layer, the polysilicon layer or the oxide semiconductor layer. A laser crystallization process or a thermal crystallization process may be further performed on the amorphous silicon layer. The oxide semiconductor layer may be formed using an oxide semiconductor material such as IGZO, ZTO or ITZO.

The gate insulation layer 120 may be formed using, e.g., silicon oxide or silicon nitride by a CVD process, a PECVD process, a vacuum evaporation process, etc. The gate insulation layer 120 may be formed to have a single-layer structured, or a multi-layered structure including, e.g., a silicon nitride layer and a silicon oxide layer.

The gate insulation layer 120 may have a substantially even or leveled (e.g., planarized) upper surface as illustrated in FIG. 5. Alternatively, the gate insulation layer 120 may be protruded at a portion overlapping with the semiconductor layer 110.

Figure 6:
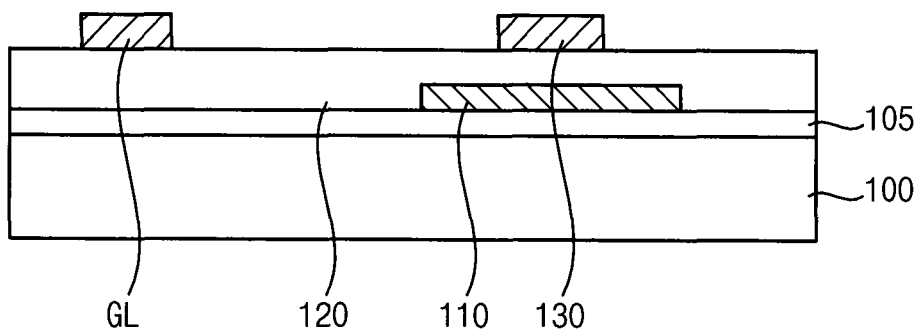

Referring to FIG. 6, a gate electrode 130 and a gate line GL may be formed on the gate insulation layer 120.

In exemplary embodiments, a first conductive layer may be formed on the gate insulation layer 120, and then the first conductive layer may be patterned by, e.g., a photolithography process to form the gate electrode 130 and the gate line GL. The first conductive layer may be formed using a metal such as Al, Mo, Ti, Cu or Ag, or an alloy thereof by a sputtering process, a CVD process, an atomic layer deposition ("ALD") process, a vacuum evaporation process, a printing process, etc. Alternatively, the first conductive layer may be formed using a transparent conductive material such as ITO, IZO or AZO.

As described with reference to FIG. 1, the gate line GL and the gate electrode 130 may be connected to and integral with each other, and may be formed by the same patterning process.

In one exemplary embodiment, impurities may be implanted into the semiconductor layer 110 using the gate electrode 130 as a mask to form ohmic contact layers (not shown) at both ends of the semiconductor layer 110. The ohmic contact layers may include n-type or p-type impurities. The ohmic contact layers may serve as a source region and a drain region. A portion of the semiconductor layer 110 between the ohmic contact layers may serve as a channel of the TFT, that may substantially overlap with the gate electrode 130.

Referring to FIG. 7, a first insulating interlayer 140 covering the gate line GL and the gate electrode 130 may be formed on the gate insulation layer 120. The first insulating interlayer 140 and the gate insulation layer 120 may be partially etched to form openings 145 partially exposing the semiconductor layer 110. In exemplary embodiments, where ohmic contact layers serve as a source region and a drain region, the ohmic contact layers may be exposed by the openings 145.

The first insulating interlayer 140 may be formed using an insulation material such as silicon oxide or silicon nitride by a CVD process, a PECVD process, a spin coating process, etc. The first insulating interlayer 140 may be protruded at a portion covering the gate electrode 130. Alternatively, when the first insulating interlayer 140 is formed to have a sufficient thickness, the first insulating interlayer 140 may have a substantially even or leveled upper surface.

Referring to FIG. 8, a source electrode 150, and a first drain electrode 155 filling the openings 145, may be formed on the first insulating interlayer 140. The source electrode 150 and the first drain electrode 155 may be in contact with the semiconductor layer 110. A second insulating interlayer 160 covering the source electrode 150 and the first drain electrode 155, may be formed on the first insulating interlayer 140.

In exemplary embodiments, a second conductive layer sufficiently filling the openings 145 may be formed on the first insulating interlayer 140. The second conductive layer may be patterned using a photoresist pattern or other mask patterns to form the source electrode 150 and the first drain electrode 155 in contact with the semiconductor layer 110. In exemplary embodiments, the source electrode 150 and the first drain electrode 155 may be in contact with the source region and the drain region of the semiconductor layer 110, respectively.

The second conductive layer may be formed using a metal such as Al, Mo, Ti, Cu or Ag, or an alloy thereof by a sputtering process, a CVD process, an ALD process, a vacuum evaporation process, a printing process, etc. Alternatively, the second conductive layer may be formed using a transparent conductive material such as ITO, IZO or AZO.

As described with reference to FIG. 1, the data line DL and the source electrode 150 may be connected to and integral with each other, and may be formed by the same patterning process.

By forming the source electrode 150 and the first drain electrode 155, a TFT including the semiconductor layer 110, the gate insulation layer 120, the gate electrode 130, the source electrode 150 and the first drain electrode 155 may be defined.

The second insulating interlayer 160 may be formed using an insulation material such as silicon oxide or silicon nitride by a CVD process, a PECVD process, a spin coating process, etc.

Referring to FIG. 9, a second drain electrode 175 electrically connected to the first drain electrode 155 via a first contact 170 may be formed on the second insulating interlayer 160.

In exemplary embodiments, the second insulating interlayer 160 may be partially etched to form a first contact hole 165 at least partially exposing the first drain electrode 155. A third conductive layer sufficiently filling the first contact hole 165 may be formed on the second insulating interlayer 160, and then the third conductive layer may be patterned. Accordingly, the first contact 170 filling the first contact hole 165 may be formed on the first drain electrode 155, and the second drain electrode 175 contacting the first contact 170 may be formed on the second insulating interlayer 160.

The third conductive layer may be formed using a metal such as Al, Mo, Ti, Cu or Ag, or an alloy thereof by a sputtering process, a CVD process, an ALD process, a vacuum evaporation process, a printing process, etc. Alternatively, the third conductive layer may be formed using a transparent conductive material such as ITO, IZO or AZO. In exemplary embodiments, the first drain electrode 155, the first contact 170 and the second drain electrode 175 may be formed using the same conductive material.

The first contact 170 and the second drain electrode 175 may be integrally formed with each other. In one exemplary embodiment, the first contact 170 may be formed, and then the second drain electrode 175 may be formed by performing additional deposition and patterning processes.

As described above, the second drain electrode 175 may be formed in and/or on a different single layer or a different single level from that of the first drain electrode 155, so that the second drain electrode 175 may be spaced apart from the data line DL in the top plan view with a minimum distance D1. In one exemplary embodiment, the second drain electrode 175 may be formed to be partially superimposed over (e.g., overlapped with) the data line DL. Therefore, an overall planar area for the TFT may be minimized in the TFT substrate or a display device including the TFT substrate.

Figure 10:
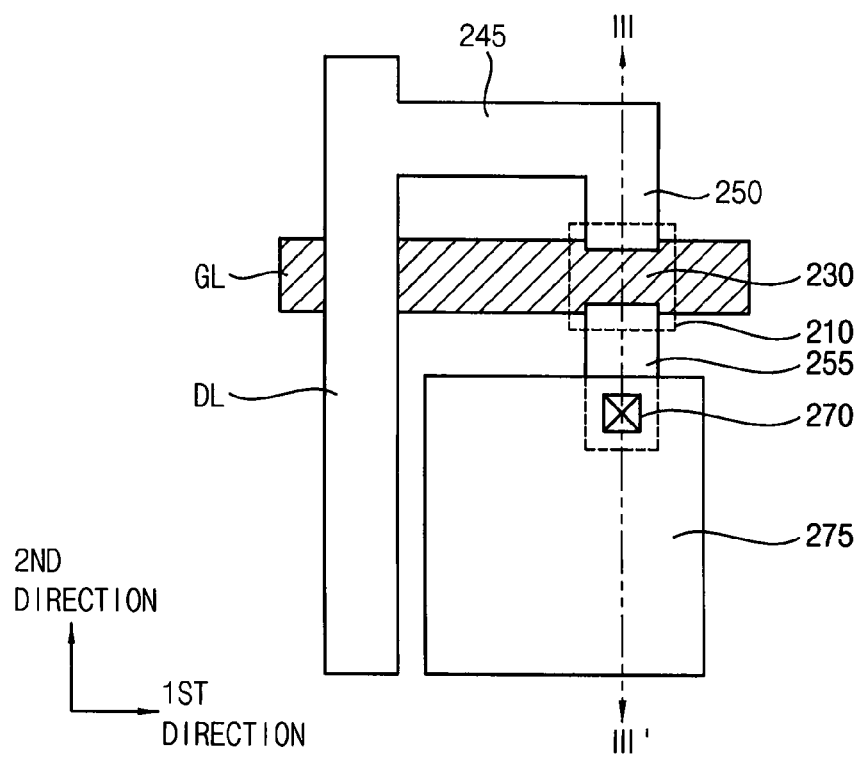
Figure 11:
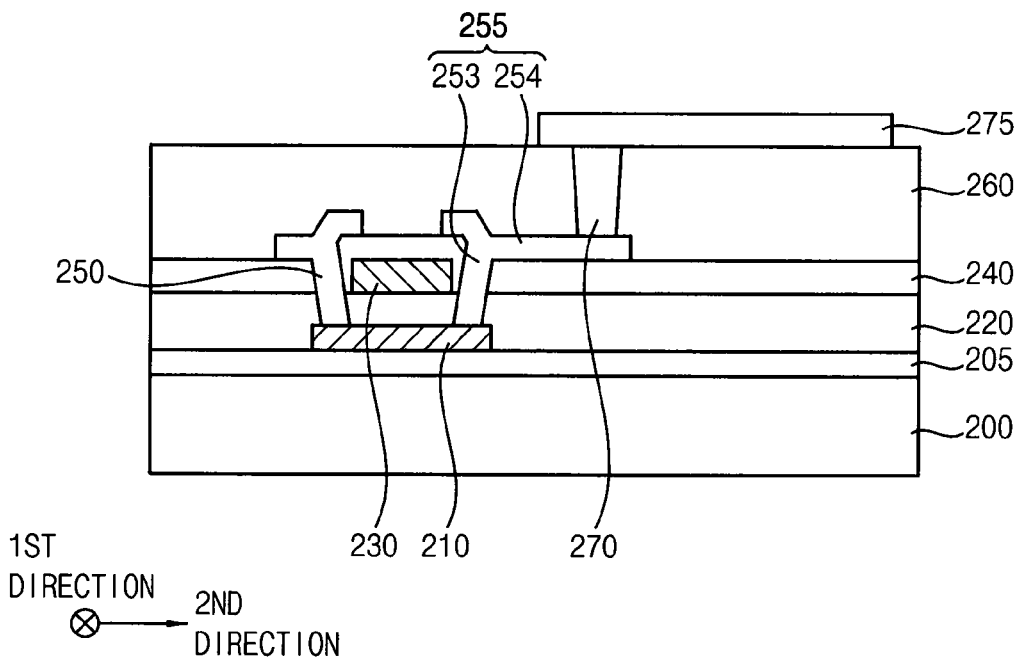

FIG. 10 is a top plan view illustrating another exemplary embodiment of a TFT substrate in accordance with the invention. FIG. 11 is a cross-sectional view taken along line III-III' of FIG. 10. Detailed descriptions on elements, structures and/or materials substantially the same as or similar to those illustrated with reference to FIGS. 1, 2A and 2B are omitted.

Referring to FIGS. 10 and 11, the TFT substrate may include a base substrate 200, a buffer layer 205, a semiconductor layer 210, a gate electrode 230, a gate insulation layer 220, a first insulating interlayer 240, a source electrode 250, a first drain electrode 255, a first contact 270, a second insulating interlayer 260 and a second drain electrode 275.

A gate line GL may extend in the first direction, and a portion of the gate line GL substantially overlapping with the semiconductor layer 210 may serve as the gate electrode 230. Accordingly, the gate electrode 230 may also extend in the first direction and be integral with the gate line GL.

A date line DL may extend in the second direction. The source electrode 250 may be integral with the data line DL via a connecting portion 245. The source electrode 250 may also extend in the second direction and be spaced apart from a main portion of the data line DL extending in the second direction. The connecting portion 245 may protrude from the data line DL in the first direction to connect the data line DL and the source electrode 250 to each other.

The first drain electrode 255 may be spaced apart from the source electrode 250 such that the first drain electrode 255 and the source electrode 250 may face each other in the second direction with respect to the gate electrode 230. In an exemplary embodiment of manufacturing the TFT substrate, the data line DL, the connecting portion 245, the source electrode 250 and the first drain electrode 255 may be formed by the same patterning process, such that data line DL, the connecting portion 245, the source electrode 250 and the first drain electrode 255 are in a same layer and/or include a same material.

A portion of the semiconductor layer 210 between the source electrode 250 and the first drain electrode 255 may substantially overlap with the gate electrode 230 to serve as a channel of the TFT. In the TFT substrate of FIG. 1, the channel may be extended along the first direction substantially the same as or parallel to an extending direction of the gate line GL. However, in an alternative exemplary embodiment of the TFT substrate of FIG. 10, the channel may be extended along the second direction substantially perpendicular to an extending direction of the gate line GL. Where the channel is extended along the second direction, a sufficient channel length may be achieved in the second direction, and thus a width of the TFT along the first direction may be decreased.

Referring to FIG. 11, the second drain electrode 275 may be disposed on the second insulating interlayer 260 to be electrically connected to the first drain electrode 255 via the first contact 270. As described above, the second drain electrode 275 may be located in and/or on a different layer or a different level from that of the first drain electrode 255 such that the second drain electrode 275 may be disposed to be more adjacent to (e.g., closer to) the data line DL in the plan view.

In exemplary embodiments, the first drain electrode 255 may include a contact portion 253 and a land portion 254. The contact portion 253 may be defined as a portion contacting the semiconductor layer 210 through the first insulating interlayer 240 and the gate insulation layer 220. The land portion 254 may be defined as a portion disposed on the first insulating interlayer 240 and continuously extending from the contact portion 253. The first contact 270 may be disposed on the land portion 254 of the first drain electrode 255 to be electrically connected to the second drain electrode 275.

Figure 12:
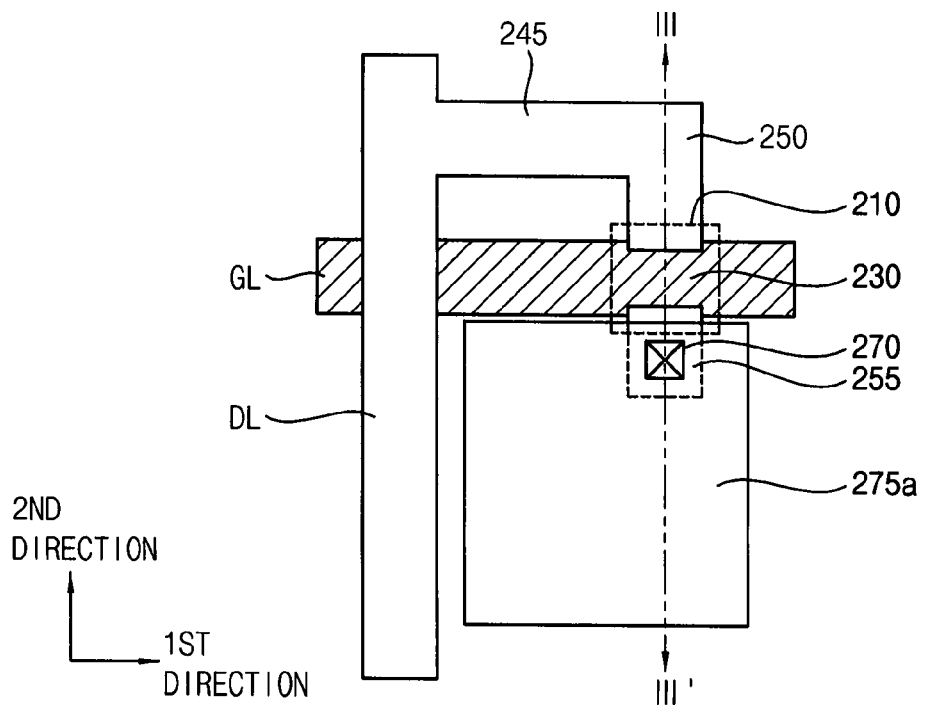
Figure 13:
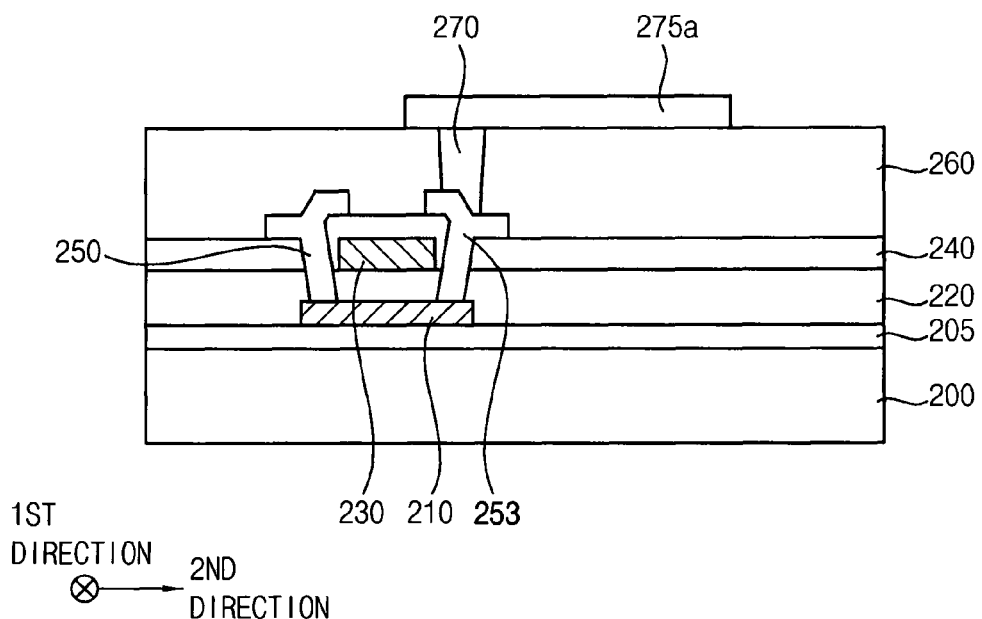

FIG. 12 is a top plan view illustrating still another exemplary embodiment of a TFT substrate in accordance with the invention. FIG. 13 is a cross-sectional view taken along line III-III' of FIG. 12. The TFT substrate may have a construction substantially the same as or similar to that illustrated with reference to FIGS. 10 and 11 except for an arrangement of a second drain electrode. Thus, detailed descriptions on elements and/or structures substantially the same as or similar to those illustrated with reference to FIGS. 10 and 11 are omitted. Like reference numerals are used to refer to like elements.

Referring to FIGS. 12 and 13, a second drain electrode 275a may be disposed to be more adjacent to (e.g., closer to) a gate electrode 230. Accordingly, a top surface of a first drain electrode 255 may be fully covered by the second drain electrode 275a.

In exemplary embodiments, a first contact 270 may be in contact with a contact portion 253 of the first drain electrode 255. Where the first contact 270 is in contact with the contact portion 253 of the first drain electrode 255, the first contact 270 and the contact portion 253 may be arranged along the same line extending vertically with respect to a top surface of a base substrate 200.

In one exemplary embodiment, the first contact 270 may be disposed on the contact portion 253 of the first drain electrode 255 as illustrated in FIG. 13. Thus, a land portion 254 illustrated in FIG. 11 of the first drain electrode 255 may be omitted. Where the land portion 254 of the first drain electrode 255 is omitted, a length of the first drain electrode 255 along the second direction may be decreased so that an area for a TFT may be additionally reduced.

The exemplary embodiments of the TFT substrates illustrated with reference to FIGS. 10 to 13 may be obtained by processes substantially the same as or similar to those illustrated with reference to FIGS. 5 to 9. Thus, detailed descriptions on methods of manufacturing the TFT substrates illustrated in FIGS. 10 to 13 are omitted.

Figure 14:
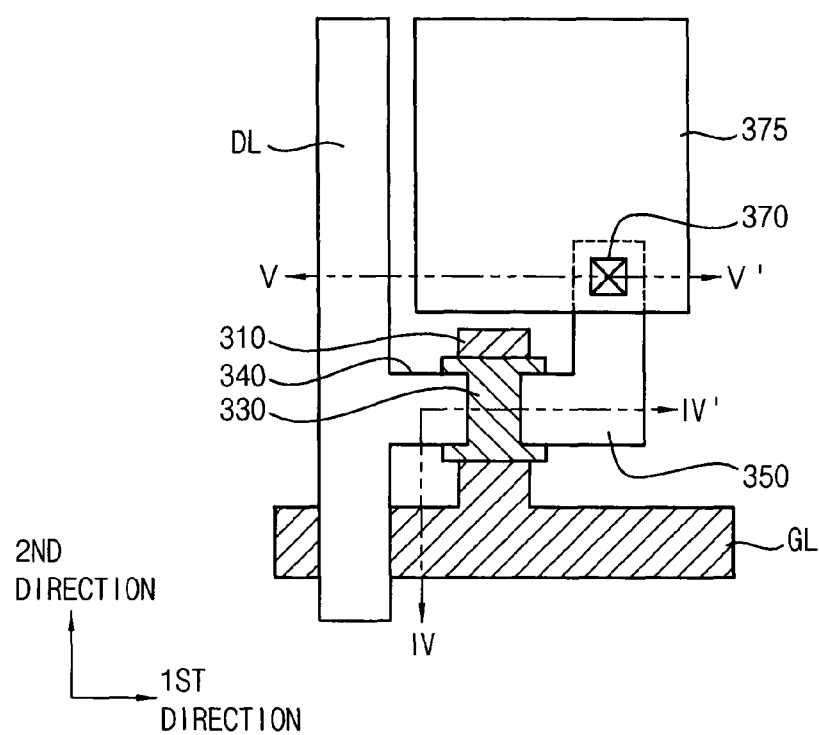
Figure 15A:
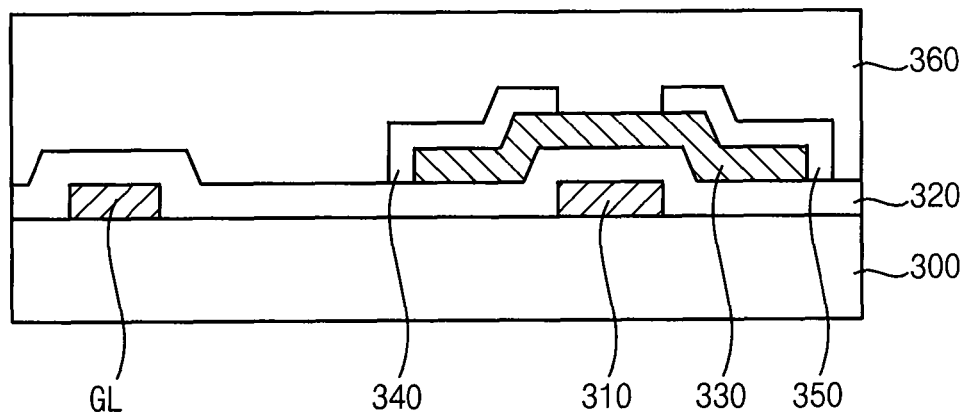
FIGS. 15A to 15B are cross-sectional views taken along line IV-IV' and V-V' of FIG. 14, respectively.
Figure 15B:
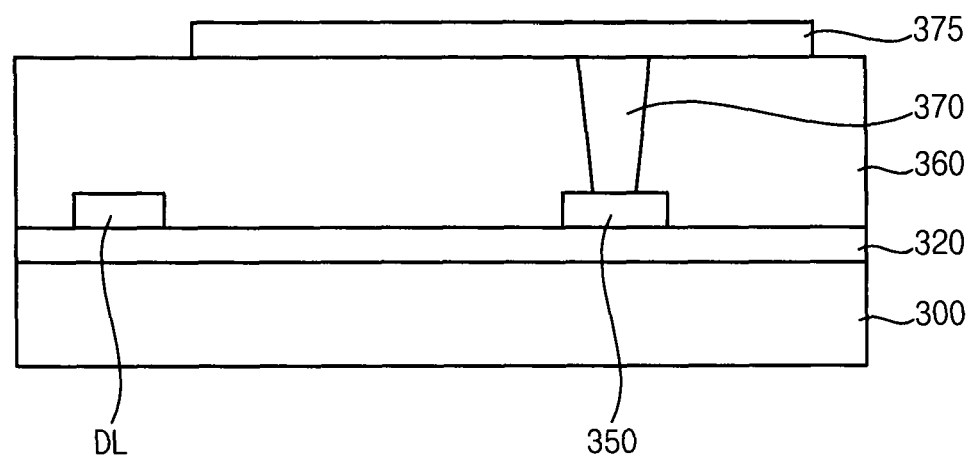

FIG. 14 is a top plan view illustrating yet another exemplary embodiment of a TFT substrate in accordance with the invention. FIGS. 15A to 15B are cross-sectional views taken along line IV-IV' and V-V' of FIG. 14, respectively. FIGS. 14, 15A and 15B illustrate the TFT substrate including a bottom gate type TFT in which a gate electrode is disposed under a semiconductor layer. Detailed descriptions on elements and/or structures substantially the same as or similar to those illustrated with reference to FIGS. 1, 2A and 2B are omitted.

Referring to FIGS. 14 to 15B, a gate line GL and a gate electrode 310 may be disposed on a base substrate 300. The gate line GL and the gate electrode 310 may be integral with each other, and the gate electrode 310 may protrude from the gate line GL in the second direction.

A gate insulation layer 320 may be disposed on the base substrate 300 to cover the gate line GL and the gate electrode 310. The gate insulation layer 320 may include a protruded portion according to shapes of the gate electrode 310 and the gate line GL. Alternatively, the gate insulation layer 320 may have a sufficient cross-sectional thickness to have a substantially even or leveled upper surface.

A semiconductor layer 330 may be disposed on the gate insulation layer 320 to cover the gate electrode 310. A source electrode 340 and a first drain electrode 350 facing each other with respect to the gate electrode 310 may be disposed on the gate insulation layer 320 and both of opposing ends of the semiconductor layer 330. A portion of the semiconductor layer 330 between the source electrode 340 and the first drain electrode 350 which may be substantially superimposed over the gate electrode 310 may define a channel of the TFT.

An insulating interlayer 360 may be disposed on the gate insulation layer 320 to cover the source electrode 340, the first drain electrode 350 and the semiconductor layer 330. The insulating interlayer 360 may include an insulation material such as silicon oxide or silicon nitride.

Referring to FIG. 15B, a second drain electrode 375 may be electrically connected to the first drain electrode 350 via a first contact 370 extended through the insulating interlayer 360. In exemplary embodiments, the second drain electrode 375 may serve as a land for a pixel electrode contact (not illustrated) when the TFT substrate is employed in a display device.

A distance between a data line DL and the second drain electrode 375 in the plan view, may be minimized without a consideration of an alignment tolerance because the second drain electrode 375 may be disposed in and/or on a different level or a different layer from those of the data line DL and the first drain electrode 350. Therefore, an overall planar area for the TFT may be minimized in the display device so that an aperture ratio and a resolution of the display device may be improved.

Figure 16:
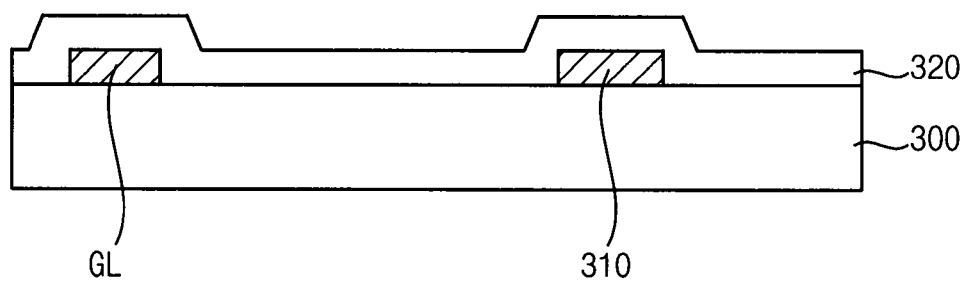
Figure 17:
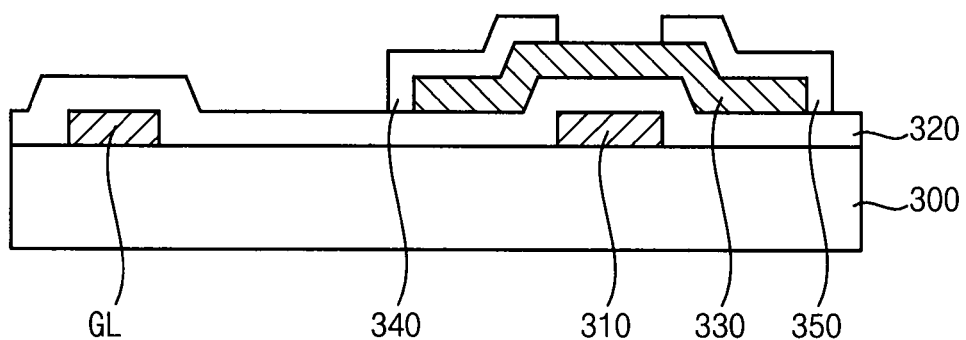
Figure 18:
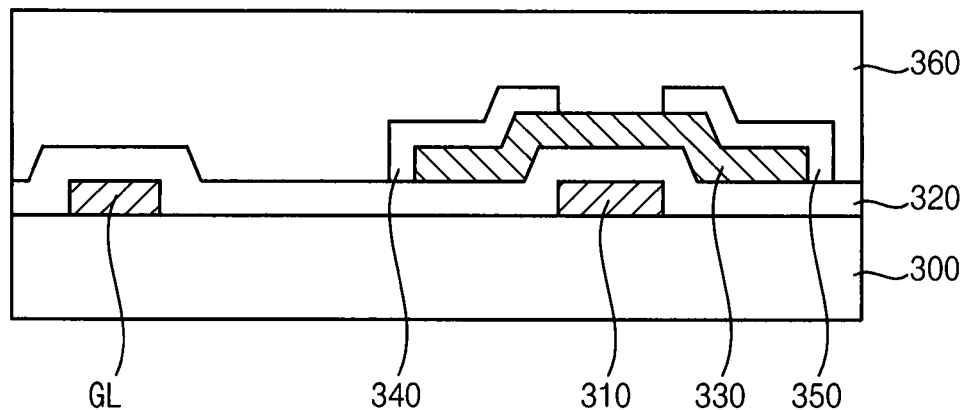
Figure 19:
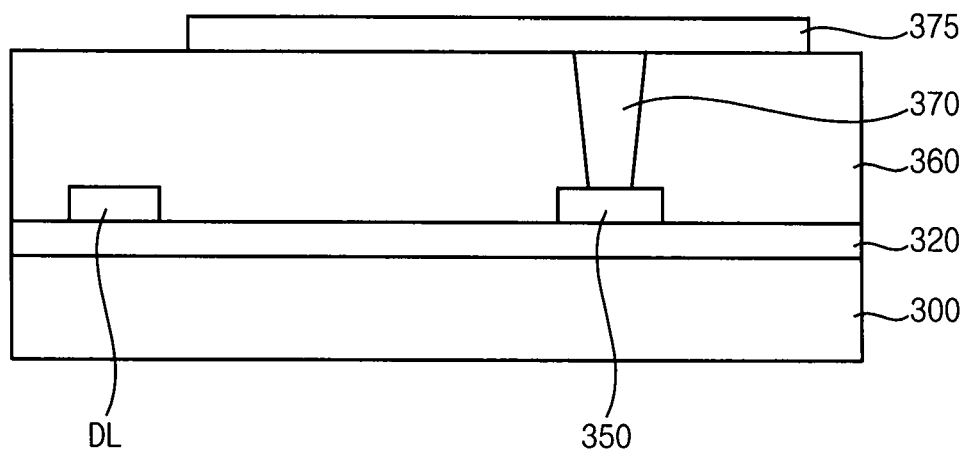

FIGS. 16 to 19 are cross-sectional views illustrating an exemplary embodiment of a method of manufacturing the TFT substrate of FIGS. 14, 15A and 15B. Specifically, FIGS. 16 to 18 are cross-sectional views taken along line IV-IV' of FIG. 14. FIG. 19 is a cross-sectional view taken along line V-V' of FIG. 14. Detailed descriptions on processes and/or materials substantially the same as or similar to those illustrated with reference to FIGS. 5 to 9 are omitted.

Referring to FIG. 16, a gate line GL and a gate electrode 310 may be formed on a base substrate 300. In exemplary embodiments, a first conductive layer may be formed on the base substrate 300, and then the first conductive layer may be patterned by, e.g., a photolithography process to form the gate line GL and the gate electrode 310. The gate line GL and the gate electrode 310 may be simultaneously formed by a patterning process utilizing a single mask.

A gate insulation layer 320 covering the gate line GL and the gate electrode 310 may be formed on the base substrate 300. The gate insulation layer 320 may have protruded portions according to shapes of the gate line GL and the gate electrode 310. Alternatively, the gate insulation layer 320 may be formed to have a substantially even or leveled upper surface by controlling deposition conditions.

Referring to FIG. 17, a semiconductor layer 330 overlapping with the gate electrode 310 may be formed on the gate insulation layer 320. A source electrode 340 and a first drain electrode 350 may be formed on both ends of the semiconductor layer 330. In exemplary embodiments, a second conductive layer may be formed on the gate insulation layer 320 and the semiconductor layer 330, and then the second conductive layer may be patterned using a photoresist pattern or other mask patterns to form the source electrode 340 and the first drain electrode 350 to be in contact with the semiconductor layer 330. A data line DL may be formed together with the source electrode 340 and the first drain electrode 350.

Referring to FIG. 18, an insulating interlayer 360 covering the source electrode 340, the first drain electrode 350 and the semiconductor layer 330 may be formed on the gate insulation layer 320. The insulating interlayer 360 may be formed using an insulation material such as silicon oxide or silicon nitride by a CVD process, a spin coating process, etc. In exemplary embodiments, the insulating interlayer may serve as a planarization layer.

Referring to FIG. 19, a second drain electrode 375 electrically connected to the first drain electrode 350 via a first contact 370 may be formed on the insulating interlayer 360. In exemplary embodiments, the insulating interlayer 360 may be partially etched to form a contact hole exposing the first drain electrode 350, and then a third conductive layer sufficiently filling the contact hole may be formed on the insulating interlayer 360. The third conductive layer may be patterned to form the second drain electrode 375 and the first contact 370.

In the bottom gate type TFT substrate of FIG. 14, the TFT channel may be formed elongated in a direction substantially parallel to an extending direction of the gate line GL. However, as illustrated in FIG. 10, the TFT channel may be formed elongated in a direction substantially perpendicular to an extending direction of the gate line GL.

Figure 20:
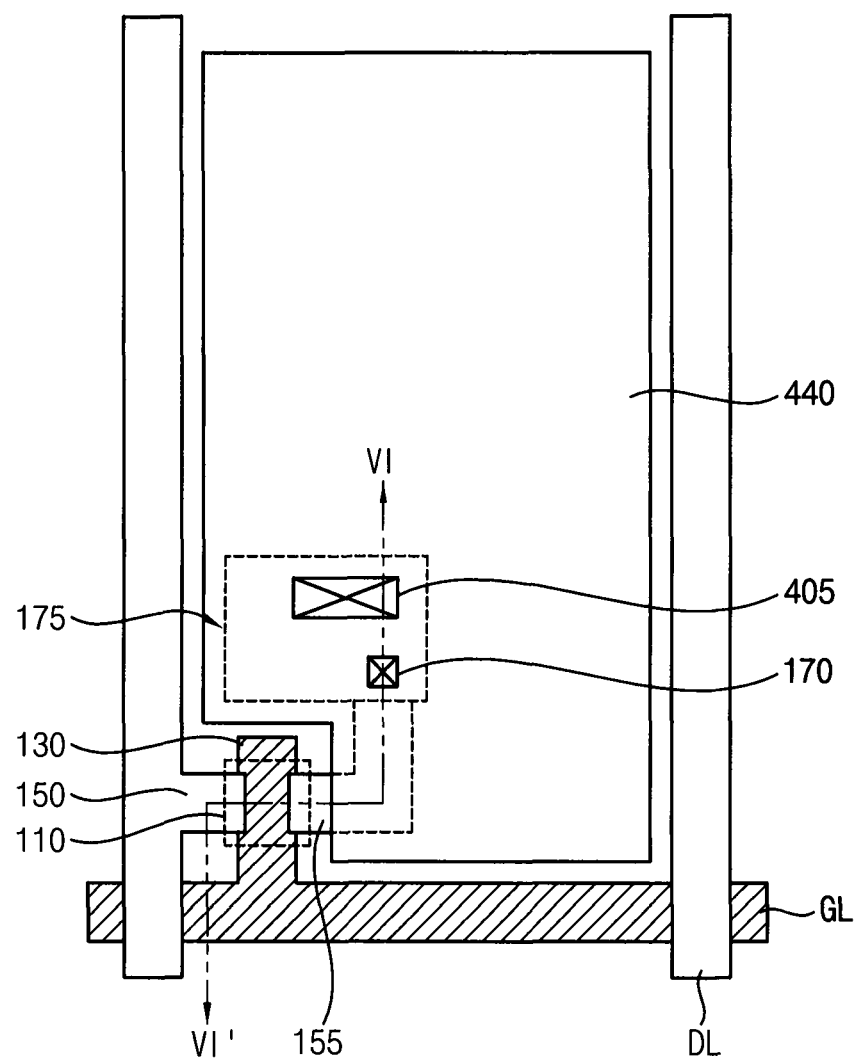
Figure 21:
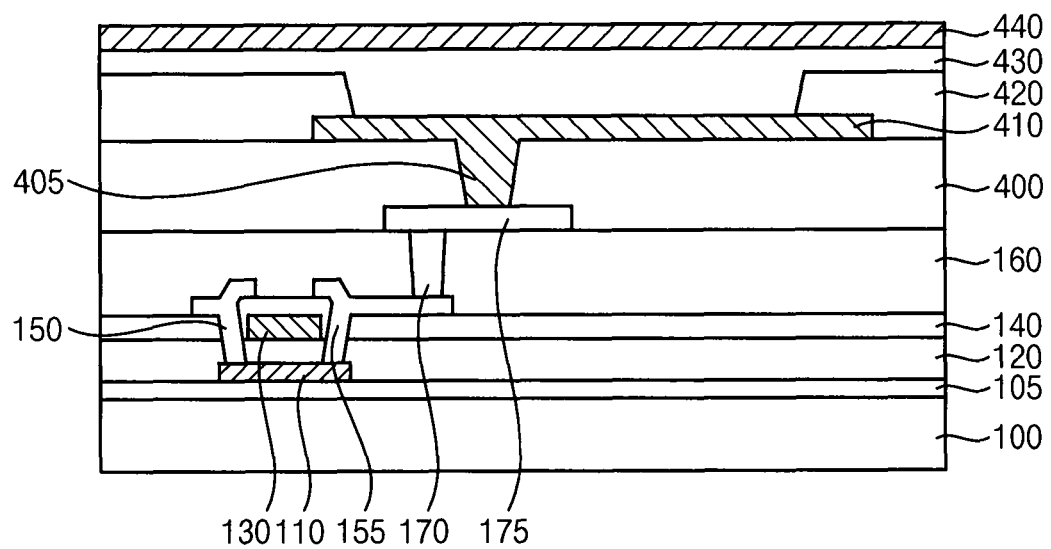

FIG. 20 is a top plan view illustrating an exemplary embodiment of a display device in accordance with the invention. FIG. 21 is a cross-sectional view taken along line VI-VI' of FIG. 20. In an exemplary embodiment, for example, FIGS. 20 and 21 illustrate an organic light emitting display ("OLED") device including the TFT substrate in accordance with the invention. Detailed descriptions on elements and/or structures substantially the same as or similar to those illustrated with reference to FIGS. 1, 2A and 2B are omitted.

Referring to FIGS. 20 and 21, the display device may include one or more of the above-described exemplary embodiments of the TFT substrate in accordance with the invention, and an organic light emitting structure formed thereon.

As described with reference to FIGS. 1, 2A and 2B, the TFT substrate may include a buffer layer 105, a semiconductor layer 110, a gate insulation layer 120, a gate electrode 130, a first insulating interlayer 140, a source electrode 150, a first drain electrode 155, a first contact 170 and a second drain electrode 175. The second drain electrode 175 may be disposed on a second insulating interlayer 160 to be electrically connected to the first drain electrode 155 via the first contact 170.

In exemplary embodiments, the TFT substrate may have a structure substantially the same as or similar to that illustrated with reference to FIGS. 10 and 11, or FIGS. 12 and 13. In one exemplary embodiment, the TFT substrate may have a bottom gate structure substantially the same as or similar to that illustrated with reference to FIGS. 14, 15A and 15B.

The organic light emitting structure may be disposed on the TFT substrate. The organic light emitting structure may include a passivation layer 400, a second contact 405, a first electrode 410, a pixel defining layer ("PDL") 420, an organic light emitting layer ("EML") 430 and a second electrode 440.

The passivation layer 400 may be disposed on the second insulating interlayer 160 to cover the second drain electrode 175. The passivation layer 400 may include a transparent insulation material having a self-planarization property. In one exemplary embodiment, for example, the passivation layer 400 may include an organic material such as an acryl-based resin, a polyimide-based resin, a siloxane-based resin or benzocyclobutene ("BCB").

The second contact 405 may extend through the passivation layer 400 to electrically connect the second drain electrode 175 and the first electrode 410 disposed on the passivation layer 400, to each other. In exemplary embodiments, the second contact 405 may be integral with the first electrode 410. The second contact 405 and the first electrode 410 may include a metal such as aluminum (Al), silver (Ag), tungsten (W), copper (Cu), nickel (Ni), chrome (Cr), molybdenum (Mo), titanium (Ti), tantalum (Ta) or neodymium (Nd), an alloy thereof or a nitride thereof. Alternatively, the second contact 405 and the first electrode 410 may include a transparent conductive material such as ITO, IZO, AZO, tin oxide or zinc oxide.

In exemplary embodiments, the second contact 405 may have a plan view dimension (e.g., diameter) or a cross-section dimension larger than those of the first contact 170. Thus, the second drain electrode 175 serving as a land for the second contact 405 may be needed in consideration of a size of the second contact 405 and an alignment tolerance. The second contact 405 may serve as pixel electrode contact of the display device, and the first electrode 410 may serve as a pixel electrode or an anode of the display device.

The PDL 420 may be disposed on the passivation layer 400 to cover peripheral portions of the first electrode 410. In one exemplary embodiment, the PDL 420 may define a pixel region of the display device, and a portion of the first electrode 410 not covered by the PDL 420 may substantially correspond to an area of the pixel region. The PDL 420 may include photosensitive material such as polyimide resin or acryl resin. Alternatively, the PDL 420 may include a non-photosensitive organic material or an inorganic material such as carbon black.

The EML 430 may be disposed on the PDL 420 and the first electrode 410 exposed by the PDL 420. In one exemplary embodiment, a hole transport layer ("HTL") (not illustrated) may be further disposed between the first electrode 410 and the EML 430.

The EML 430 may include at least one of light emitting materials for generating different colors of light, for example, a red color of light, a green color of light or a blue color of light. In one exemplary embodiment, the EML 430 may include a combination of the light emitting materials for generating a white color of light.

The HTL may include a hole transport material, for example, 4,4'-bis[N-(1-naphthyl)-N-phenylamino]biphenyl ("NPB"), 4,4'-bis[N-(3-methylphenyl)-N-phenylamino] biphenyl ("TPD"), N,N'-di-[(1-naphthyl)-N,N'-diphenyl]-1, 1'-biphenyl)-4,4'-diamine ("NPD"), N-phenylcarbazole, polyvinylcarbazole or a combination thereof.

As illustrated in FIG. 21, the EML 430 may be disposed continuously on surfaces of the PDL 420 and the first electrode 410. Alternatively, the EML 430 may be patterned in each pixel to be a discrete element confined by sidewalls of the PDL 420.

The second electrode 440 may be disposed on the EML 430. The second electrode 440 may include a metal such as lithium (Li), calcium (Ca), lithium fluoride/calcium (LiF/Ca), LiF/Al, Al, Mg, Ag, Cr, W, Mo or Ti and an alloy thereof. In one exemplary embodiment, the second electrode 440 may include a transparent conductive material such as ITO, IZO, AZO, tin oxide or zinc oxide. The second electrode 440 may serve as a cathode of the display device.

The second electrode 440 may be disposed continuously on a substantially entire surface of the display device, such as to serve as a common electrode. Alternatively, the second electrode 440 may be patterned in each pixel, such as to include a plurality of discrete portions. Where the second electrode 440 includes a plurality of discrete portions, the portions of the collective second electrode 440 may be respectively confined by the sidewalls of the PDL 420 together with the EML 430.

In one exemplary embodiment, an electron transport layer ("ETL") (not illustrated) may be further disposed between the second electrode 440 and the EML 430. The ETL may include an electron transport material, for example, tris(8-quinolinolato)aluminum ("Alq3"), 2-(4-biphenylyl)-5-(4-tert-butylphenyl)-1,3,4-oxadiazole ("PBD"), bis(2-methyl-8-quinolinolato)(4-phenylphenolato)aluminum ("Balq"), bathocuproine ("BCP") or a combination thereof.

Figure 22:
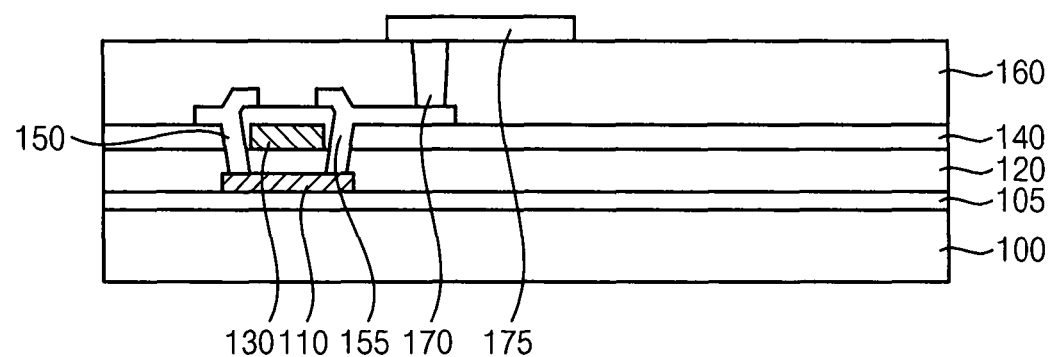
Figure 23:
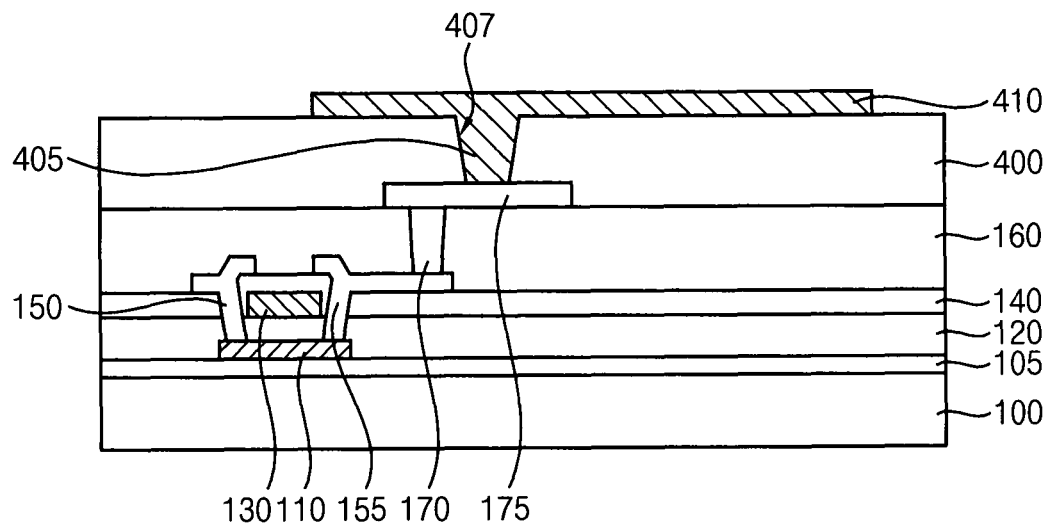
Figure 24:
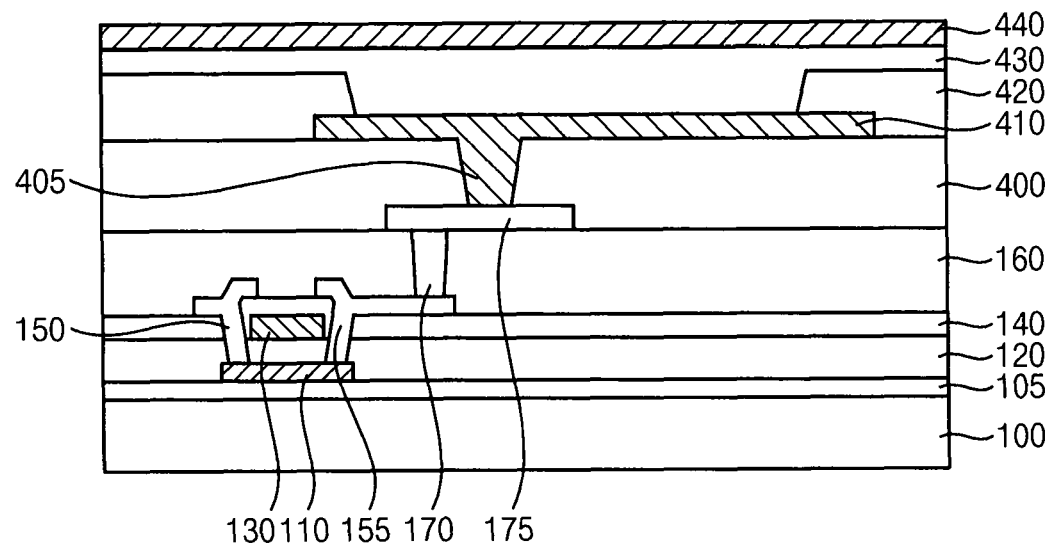

FIGS. 22 to 24 are cross-sectional views illustrating an exemplary embodiment of a method of manufacturing the display device of FIGS. 20 and 21.

Referring to FIG. 22, processes substantially the same as or similar to those illustrated with reference to FIGS. 5 to 9 may be performed to form a TFT substrate in accordance with one or more exemplary embodiment of the invention. The TFT substrate may have a structure substantially the same as or similar to that illustrated with reference to FIG. 1, FIG. 10 or FIG. 12.

In one exemplary embodiment, processes substantially the same as or similar to those illustrated with reference to FIGS. 16 to 19 may be performed to form an exemplary embodiment of the TFT substrate in accordance with the invention. Where the TFT substrate is formed with reference to FIGS. 16 to 19, the TFT substrate may have a structure substantially the same as or similar to that illustrated with reference to FIG. 14.

Referring to FIG. 23, a passivation layer 400 covering a second drain electrode 175 may be formed on a second insulating interlayer 160. A second contact 405 may be formed extended through the passivation layer 400 to be in contact with the second drain electrode 175. A first electrode 410 may be formed on the passivation layer 400 to be electrically connected to the second drain electrode 175 via the second contact 405.

The passivation layer 400 may be formed using a transparent organic material such as an acryl-based resin, a polyimide-based resin, a siloxane-based resin or BCB. The passivation layer 400 may be formed by a spin coating process, a slit coating process, etc. In one exemplary embodiment, a planarization process may be further performed on an upper surface of the passivation layer 400.

The passivation layer 400 may be partially etched to form a second contact hole 407 partially exposing a top surface of the second drain electrode 175, and then a conductive layer filling the second contact hole 407 may be formed on the passivation layer 400, a sidewall and a bottom surface of the second contact hole 407. The conductive layer may be patterned to obtain the second contact 405 and the first electrode 410. In exemplary embodiments, the second contact 405 and the first electrode 410 may be integrally formed with each other.

The conductive layer may be formed using a metal such as Al, Ag, W, Cu, Ni, Cr, Mo, Ti, Ta or Nd, an alloy thereof or a nitride thereof. Alternatively, the conductive layer may be formed using a transparent conductive material such as ITO, IZO, AZO, tin oxide or zinc oxide. The conductive layer may be obtained by a sputtering process, a CVD process, an ALD process, a vacuum evaporation process, a printing process, etc.

Referring to FIG. 24, a PDL 420 covering peripheral portions of the first electrode 410 may be formed on the passivation layer 400 to define a pixel region of the display device. An EML 430 and a second electrode 440 may be sequentially formed on the PDL 420 and the first electrode 410.

In one exemplary embodiment, for example, a photosensitive material layer including, e.g., an acryl-based resin, a polyimide-based resin or BCB may be formed on the passivation layer 400 and the first electrode 410. The photosensitive material layer may be patterned by an exposure process and a developing process to form the PDL 420. Alternatively, non-photosensitive organic or inorganic layers may be formed on the passivation layer 400 and the first electrode 410, and then the non-photosensitive organic or inorganic layers may be partially etched to form the PDL 420.

The EML 430 may be formed using at least one of light emitting materials for generating different colors of light, for example, a red color of light, a green color of light or a blue color of light. In one exemplary embodiment, the EML 430 may be formed using a combination of the light emitting materials for generating a white color of light. The EML 430 may be formed by a spin coating process, a roll printing process, a nozzle printing process, an inkjet printing process, a transfer process using a donor substrate, etc.

The EML 430 may be formed continuously on surfaces of the PDL 420 and the first electrode 410 as illustrated in FIG. 24. Alternatively, the EML 430 may be patterned to form discrete portions confined by sidewalls of the PDL 420.

In one exemplary embodiment, an HTL may be further formed between the EML 430 and the first electrode 410 using the above mentioned hole transport material. In one exemplary embodiment, an ETL may be further formed on the EML 430 using the above mentioned electron transport material. The HTL and the ETL may be formed by a spin coating process, a roll printing process, a nozzle printing process, an inkjet printing process, a transfer process using a donor substrate, etc.

The second electrode 440 may be formed using a metal such as Li, Ca, LiF/Ca, LiF/Al, Al, Mg, Ag, Cr, W, Mo or Ti, or an alloy thereof. In one exemplary embodiment, the second electrode 440 may be formed using a transparent conductive material such as ITO, IZO, AZO, tin oxide or zinc oxide. The second electrode 440 may be obtained by a sputtering process, a CVD process, an ALD process, a vacuum evaporation process, a printing process, etc.

The second electrode 440 may be formed continuously on a substantially entire surface of the display device. Alternatively, the second electrode 440 may be patterned to form discrete portion respectively disposed in each pixel.

Additionally, an optical sheet (not shown), a polarization film (not shown) and an upper transparent substrate (not shown) may be optionally formed on the second electrode 440 to manufacture the display device.

According to one or more exemplary embodiment of the invention, an area for the TFT may be minimized in a display device so that an aperture ratio and a resolution of the display device may be improved.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A thin film transistor substrate, comprising:
   a data line and a gate line which cross each other on a base substrate;
   a gate electrode of a thin film transistor, electrically connected to the gate line;
   a source electrode of the thin film transistor, electrically connected to the data line;
   a first drain electrode of the thin film transistor, which faces the source electrode;
   a semiconductor layer which serves as a channel of the thin film transistor, between the source electrode and the first drain electrode; and
   a second drain electrode of the thin film transistor, electrically connected to both the first drain electrode and a first electrode,
   wherein the second drain electrode is in a different layer than the data line and disposes the first drain electrode between the base substrate and second drain electrode.

2. The thin film transistor substrate of claim 1, wherein the first electrode is a pixel electrode of a display device, and
   the second drain electrode comprises a land portion which is connected to a contact of the pixel electrode.

3. The thin film transistor substrate of claim 1, wherein the second drain electrode is in a different layer from that of the first drain electrode.

4. The thin film transistor substrate of claim 1, further comprising a first contact which electrically connects the first drain electrode and the second drain electrode to each other.

5. The thin film transistor substrate of claim 1, wherein the channel extends in a direction parallel to an extending direction of the gate line.

6. The thin film transistor substrate of claim 1, wherein the channel extends in a direction perpendicular to an extending direction of the gate line.

7. The thin film transistor substrate of claim 6, wherein the source electrode is connected to the data line via a connecting portion which protrudes from the data line.

8. The thin film transistor substrate of claim 6, wherein the second drain electrode fully covers a top surface of the first drain electrode.

9. The thin film transistor substrate of claim 8, further comprising a first contact which electrically connects the first drain electrode and the second drain electrode to each other,
   wherein the first contact and the first drain electrode are arranged along the same line extending vertically with respect to a top surface of the base substrate.

10. The thin film transistor substrate of claim 1, further comprising a gate insulation layer which is on the base substrate and covers the semiconductor layer,
    wherein the semiconductor layer is between the gate electrode and the base substrate.

11. The thin film transistor substrate of claim 1, further comprising a gate insulation layer which is on the base substrate and covers the gate electrode on the base substrate,
wherein the gate electrode is between the semiconductor layer and the base substrate.

12. The thin film transistor substrate of claim 1, wherein in a top plan view,
the second drain electrode is disposed proximate to the semiconductor layer in an extending direction of the data line, and
the first drain electrode extends at a first end thereof from the semiconductor layer to be connected, at a second end of the first drain electrode opposite to the first end thereof, to the second drain electrode disposed adjacent to the semiconductor layer in the extending direction of the data line.

13. The thin film transistor substrate of claim 1, wherein in a top plan view,
the second drain electrode is disposed proximate to the semiconductor layer in an extending direction of the data line and overlaps the data line.

14. A display device, comprising:
a base substrate;
a data line and a gate line which cross each other on the base substrate;
a thin film transistor on the base substrate, the thin film transistor comprising a gate electrode connected to the gate line, a gate insulation layer, a semiconductor layer, a source electrode connected to the data line, and a first drain electrode;
a second drain electrode of the thin film transistor, is electrically connected to the first drain electrode, is in a different layer than the data line and disposes the first drain electrode between the base substrate and second drain electrode;
a first electrode electrically connected to the second drain electrode;
an organic light emitting layer on the first electrode; and
a second electrode on the organic light emitting layer.

15. The display device of claim 14, further comprising:
a first contact which contacts the first drain electrode and the second drain electrode, and electrically connects the first drain electrode and the second drain electrode; and
a second contact which contacts the second drain electrode and the first electrode, and electrically connects the second drain electrode and the first electrode.

16. The display device of claim 15, wherein the second contact has a top plan view dimension or a cross-section dimension larger than that of the first contact.

17. The display device of claim 15, further comprising an insulating interlayer which covers the thin film transistor.

18. The display device of claim 17, wherein
the first contact extends through the insulating interlayer and electrically connects the first drain electrode and the second drain electrode, and
the second drain electrode is on the insulating interlayer, and in a different layer than that of the first drain electrode.

* * * * *